(12) United States Patent
Hoefnagels et al.

(10) Patent No.: US 10,534,271 B2
(45) Date of Patent: Jan. 14, 2020

(54) LITHOGRAPHY APPARATUS AND A METHOD OF MANUFACTURING A DEVICE

(71) Applicant: ASML NETHERLANDS B.V., Veldhoven (NL)

(72) Inventors: Pieter Jeroen Johan Emanuel Hoefnagels, Eindhoven (NL); Ronald Frank Kox, Peer (BE); John Maria Bombeeck, Eindhoven (NL); Johannes Cornelis Paulus Melman, Oisterwijk (NL); Ruud Hendrikus Martinus Johannes Bloks, Helmond (NL); Patricius Jacobus Neefs, Raamsdonksveer (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 16/477,955

(22) PCT Filed: Dec. 4, 2017

(86) PCT No.: PCT/EP2017/081345
§ 371 (c)(1),
(2) Date: Jul. 15, 2019

(87) PCT Pub. No.: WO2018/137816
PCT Pub. Date: Aug. 2, 2018

(65) Prior Publication Data
US 2019/0361357 A1 Nov. 28, 2019

(30) Foreign Application Priority Data

Jan. 26, 2017 (EP) .................................... 17153339

(51) Int. Cl.
*G03B 27/52* (2006.01)
*G03F 7/20* (2006.01)

(52) U.S. Cl.
CPC ...... *G03F 7/70341* (2013.01); *G03F 7/70866* (2013.01)

(58) Field of Classification Search
CPC ............. G03F 7/70341; G03F 7/70866; G03F 7/70716; G03F 7/70858
See application file for complete search history.

(56) References Cited

U.S. PATENT DOCUMENTS

| 2004/0207824 A1 | 10/2004 | Lof et al. |
| 2007/0058152 A1 | 3/2007 | Zaal et al. |

(Continued)

FOREIGN PATENT DOCUMENTS

| EP | 1420298 | 5/2004 |
| JP | 2011222652 | 11/2011 |

OTHER PUBLICATIONS

International Search Report and Written Opinion issued in corresponding PCT Patent Application No. PCT/EP2017/081345, dated Feb. 16, 2018.

*Primary Examiner* — Peter B Kim
(74) *Attorney, Agent, or Firm* — Pillsbury Winthrop Shaw Pittman, LLP

(57) ABSTRACT

A device manufacturing method includes: confining a liquid to an immersion space between a projection system and an object; starting application of an underpressure to an extraction unit to remove fluid from a position proximate an edge of the object before the immersion space moves onto the object; moving the support table along a route comprising a series of motions such that a plurality of target positions on the object pass under the projection system; projecting through the immersion space a beam onto the target portions as the target portions pass under the projection system, the projecting performed to account for a certain predetermined thermal profile in the object; and stopping application of the underpressure at a predetermined time after the immersion (Continued)

space moves off the object for the last time during the series of motions to at least partly induce the certain predetermined thermal profile in the object.

20 Claims, 5 Drawing Sheets

(56) References Cited

U.S. PATENT DOCUMENTS

| | | |
|---|---|---|
| 2008/0246938 A1 | 10/2008 | Shima et al. |
| 2008/0297744 A1 | 12/2008 | De Jong et al. |
| 2008/0304025 A1 | 12/2008 | Chang et al. |
| 2010/0045949 A1 | 2/2010 | Nakano et al. |
| 2010/0313974 A1 | 12/2010 | Riepen et al. |
| 2011/0007288 A1 | 1/2011 | Brinkhof et al. |
| 2013/0045447 A1 | 2/2013 | Kunnen et al. |
| 2013/0135596 A1* | 5/2013 | Hara .................. G03F 7/70341 355/30 |

\* cited by examiner

LITHOGRAPHY APPARATUS AND A METHOD OF MANUFACTURING A DEVICE

CROSS-REFERENCE TO RELATED APPLICATIONS

This application is the U.S. national phase entry of PCT Patent Application No. PCT/EP2017/081345, which was filed on Dec. 4, 2017, which claims the benefit of priority of European patent application no. 17153339.1, which was filed on Jan. 26, 2017 and which is incorporated herein in its entirety by reference.

FIELD

The present invention relates to a lithography apparatus and a method of manufacturing a device using a lithography apparatus.

BACKGROUND

A lithography apparatus is a machine that applies a desired pattern onto a substrate, usually onto a target portion of the substrate. A lithography apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithography apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti parallel to this direction.

In an immersion lithography apparatus, a liquid is confined to an immersion space by a liquid confinement structure. The immersion space is between a final optical element of a projection system through which the pattern is imaged and the substrate onto which the pattern is transferred or a support table on which the substrate is held. The liquid may be confined to the immersion space by a fluid seal. The liquid confinement structure may create or use a flow of gas, for example to help in controlling the flow and/or the position of the liquid in the immersion space. The flow of gas may help form the seal to confine the liquid to the immersion space.

Defects in the pattern applied to the substrate are undesirable as they reduce the yield, i.e. the number of usable devices per substrate. Because many patterning steps are required to make a device, even a very low rate of defects per exposure can significantly reduce the yield. Generally there is a gap between the edge of the substrate or other object over which the liquid confinement structure passes and the support table Immersion liquid may leak into this gap. The presence in the gap of immersion liquid can cause difficulties including applying a thermal load on the substrate by evaporation, but also risking getting parts of the apparatus wet. Therefore immersion liquid in the gap is desirably removed from the gap between the substrate or other object and the support table using an extraction system. One way in which the extraction system can remove this immersion liquid is to connect the gap to an underpressure source. In that way any immersion liquid in the gap is drawn out of the gap through the support table and thereby removed from the gap.

A difficulty with using an underpressure source to remove immersion liquid from the gap is that this can induce a large cooling load on the substrate or object due to accelerated evaporation of the immersion liquid resulting from gas flow into the gap. A cooling load on the substrate or object is undesirable as this can lead to imaging errors, particularly overlay errors.

SUMMARY

It is desirable, for example, to provide a system in which imaging errors induced due to cooling loads resulting from removal of immersion liquid from a gap between an object and a support table by an extraction system are reduced.

According to an aspect, there is provided a device manufacturing method comprising: confining a liquid to an immersion space between a projection system and a facing surface of an object on a support table and/or the support table using a liquid confinement structure; starting application of an underpressure to an extraction unit to remove fluid from a position proximate an edge of the object before the immersion space moves onto the object; moving the support table along a route comprising a series of motions such that a plurality of target positions on the object pass under the projection system; projecting through the immersion space a patterned beam onto the target portions of the object as the target portions pass under the projection system, wherein the projecting is performed to account for a certain predetermined thermal profile in the object; stopping application of the underpressure at a predetermined time after the immersion space moves off the object for the last time during the series of motions, thereby at least partly to induce the certain predetermined thermal profile in the object.

According to an aspect, there is provided an immersion lithography apparatus comprising: a support table configured to support an object having at least one target portion; an extraction unit for removing fluid from a position proximate an edge of the object; a projection system configured to project a patterned beam onto the object; a positioner configured to move the support table relative to the projection system; a liquid confinement structure configured to confine a liquid to an immersion space between the projection system and a surface of the object and/or the support table; and a controller configured to control the positioner to move the support table to follow a route comprised of a series of motions such that a plurality of target positions on the object pass under the projection system, the controller adapted to: start application of an underpressure to the extraction unit to remove fluid from a position proximate an edge of the object before the immersion space moves onto the object; control the projection system to project through the immersion space a patterned beam onto the target portions of the object as the target portions pass under the projection system, in which the projecting is performed to account for a certain predetermined thermal profile in the object; and stop application of the underpressure a predetermined time after the immersion space moves off the object for the last time during the series of motions, thereby at least partly to induce the certain predetermined thermal profile in the object.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
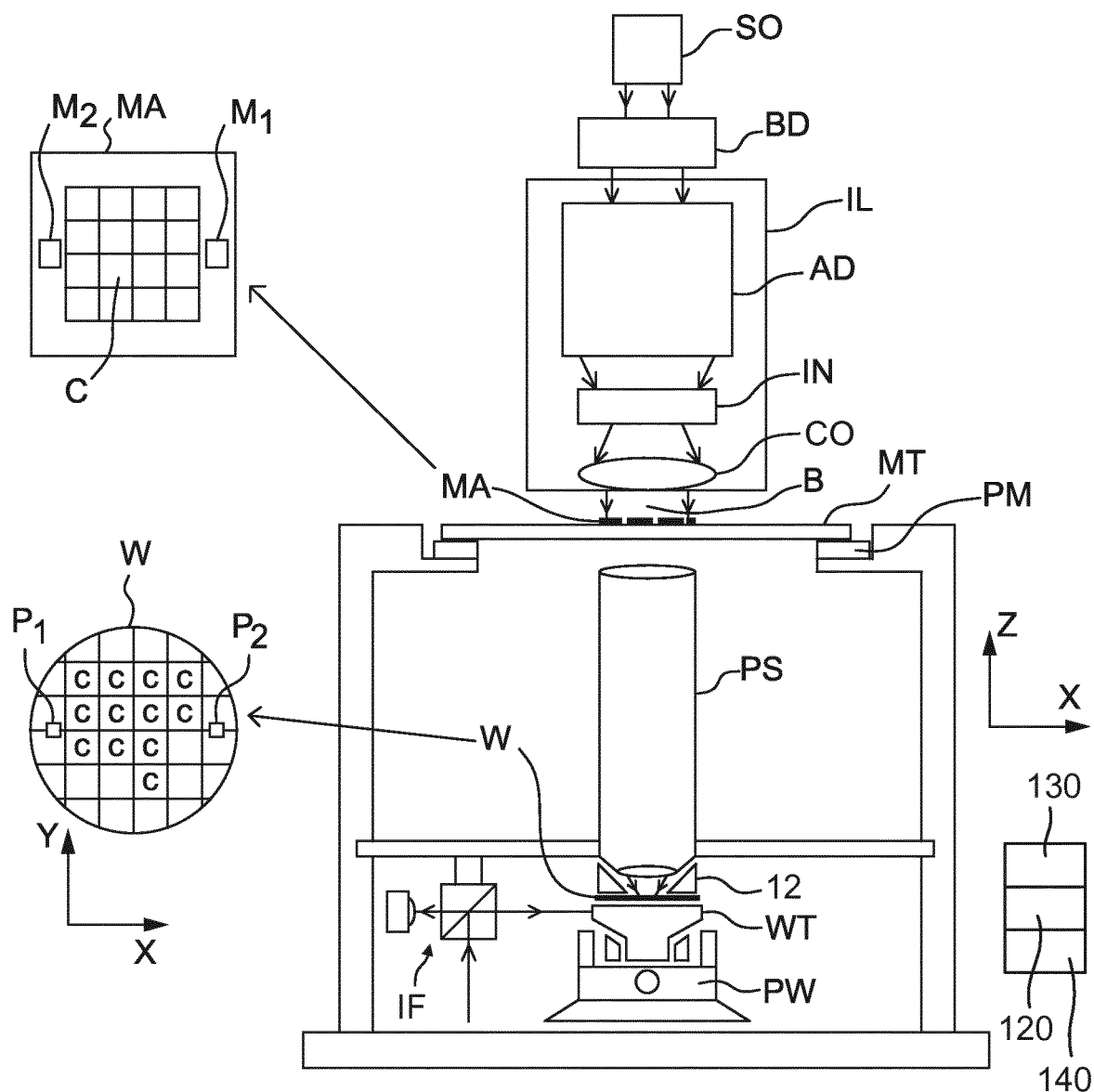
FIG. 1 schematically depicts a lithography apparatus.

FIG. 1 schematically depicts a lithography apparatus according to one embodiment of the invention. The apparatus includes an illumination system (illuminator) ILL configured to condition a projection beam B (e.g. UV radiation or any other suitable radiation), a support structure (e.g. a mask table) MT constructed to support a patterning device (e.g. a mask) MA and connected to a first positioning device PM configured to accurately position the patterning device in accordance with certain parameters. The apparatus also includes a support table (e.g. a wafer table) WT or "substrate support" or "substrate table" constructed to hold a substrate (e.g. a resist-coated wafer) W and connected to a second positioning device PW under control of positioner 130 configured to accurately position the substrate in accordance with certain parameters. The apparatus further includes a projection system (e.g. a refractive projection lens system) PS configured to project a pattern imparted to the projection beam B by the patterning device MA onto a target portion C (e.g. including one or more dies) of the substrate W.

The illumination system IL may include various types of optical components, such as refractive components, reflective components, magnetic components, electromagnetic components, electrostatic components or other types of optical components, or any combination thereof, for directing, shaping, or controlling radiation.

The support structure MT supports, i.e. bears the weight of, the patterning device MA. It holds the patterning device MA in a manner that depends on the orientation of the patterning device MA, the design of the lithography apparatus, and other conditions, such as for example whether or not the patterning device MA is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion C of the substrate W. It should be noted that the pattern imparted to the projection beam B may not exactly correspond to the desired pattern in the target portion C of the substrate W, for example if the pattern includes phase-shifting features or so called assist features. Generally, the pattern imparted to the projection beam B will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithography apparatus may be of a type having two (dual stage) or more stages or tables. At least one of the tables has a substrate support that can hold a substrate. At least one of the tables may be a measurement table that is not configured to hold a substrate. In an embodiment two or more of the tables each have a substrate support. The lithography apparatus may have two or more patterning device tables or "mask supports". In such "multiple stages" machines the additional tables or supports may be used in parallel, or preparatory steps may be carried out on one or more tables or supports while one or more other tables or supports are being used for exposure.

The lithography apparatus is of a type wherein at least a portion of the substrate W may be covered by a liquid having a relatively high refractive index, e.g. water such as ultra pure water (UPW), so as to fill an immersion space between the projection system PS and the substrate W. An immersion liquid may also be applied to other spaces in the lithography apparatus, for example, between the patterning device MA and the projection system PS. Immersion techniques can be used to increase the numerical aperture of projection systems. The term "immersion" as used herein does not mean that a structure, such as a substrate W, must be submerged in liquid; rather "immersion" only means that a liquid is located between the projection system PS and the substrate W during exposure. The path of the patterned radiation beam from the projection system PS to the substrate W is entirely through liquid.

Referring to FIG. 1, the illuminator IL receives a radiation beam from a radiation source SO. The source and the lithography apparatus may be separate entities, for example when the source is an excimer laser. In such cases, the source is not considered to form part of the lithography apparatus. In arrangements where the source is separate from the lithography apparatus, the radiation beam is passed from the source SO to the illuminator IL with the aid of a beam delivery system BD including, for example, suitable directing mirrors and/or a beam expander. In other cases the source may be an integral part of the lithography apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as -outer and -inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section. Similar to the source SO, the illuminator IL may or may not be considered to form part of the lithography apparatus. For example, the illuminator IL may be an integral part of the lithography apparatus or may be a separate entity from the lithography apparatus. In the latter case, the lithography apparatus may be configured to allow the illuminator IL to be mounted thereon. Optionally, the illuminator IL is detachable and may be separately provided (for example, by the lithography apparatus manufacturer or another supplier).

The projection beam B is incident on the patterning device MA (e.g., mask), which is held on the support structure MT (e.g., mask table), and is patterned by the patterning device MA. The projection beam B having been patterned by the patterning device MA may be referred to as a patterned beam. Having traversed the patterning device MA, the projection beam B passes through the projection system PS, which focuses the beam onto a target portion C of the substrate W. With the aid of the second positioning device PW and position sensor IF (e.g. an interferometric device, encoder or capacitive sensor), the support table WT can be moved accurately, e.g. so as to position different target portions C in the path of the projection beam B. Similarly, the first positioning device PM and another position sensor (which is not explicitly depicted in FIG. 1) can be used to accurately position the patterning device MA with respect to the path of the projection beam B, e.g. after mechanical retrieval from a mask library, or during a scan.

In general, movement of the support structure MT may be realized with the aid of a long-stroke module (coarse positioning) and a short-stroke module (fine positioning), which form part of the first positioning device PM. Similarly, movement of the support table WT or "substrate support" may be realized using a long-stroke module and a short-stroke module, which form part of the second positioning device PW.

The patterning device MA and substrate W may be aligned using patterning device alignment marks M1, M2 and substrate alignment marks P1, P2. Although the substrate alignment marks P1, P2 as illustrated occupy dedicated target portions, they may be located in spaces between target portions (these are known as scribe-lane alignment marks). Similarly, in situations in which more than one die is provided on the patterning device, the patterning device alignment marks M1, M2 may be located between the dies.

The lithographic apparatus further includes a control unit 120 which controls all the movements and measurements of the various actuators and sensors described. The control unit 120 also includes signal processing and data processing capacity to implement desired calculations relevant to the operation of the lithographic apparatus. In practice, the control unit 120 will be realized as a system of many sub-units, each handling the real-time data acquisition, processing and control of a subsystem or component within the lithographic apparatus. For example, one processing subsystem may be dedicated to servo control of the second positioning device PW. Separate units may handle different actuators, or different axes. Another sub-unit might be dedicated to the readout of the position sensor IF. Overall control of the lithographic apparatus may be controlled by a central processing unit. The central processing unit may communicate with the sub-units, with operators and with other apparatuses involved in the lithographic manufacturing process.

Arrangements for providing liquid between a final optical element of the projection system PS and the substrate can be classed into three general categories. These are the bath type arrangement, the so-called localized immersion systems and the all-wet immersion systems. An embodiment of the present invention relates particularly to the localized immersion systems.

Figure 2:
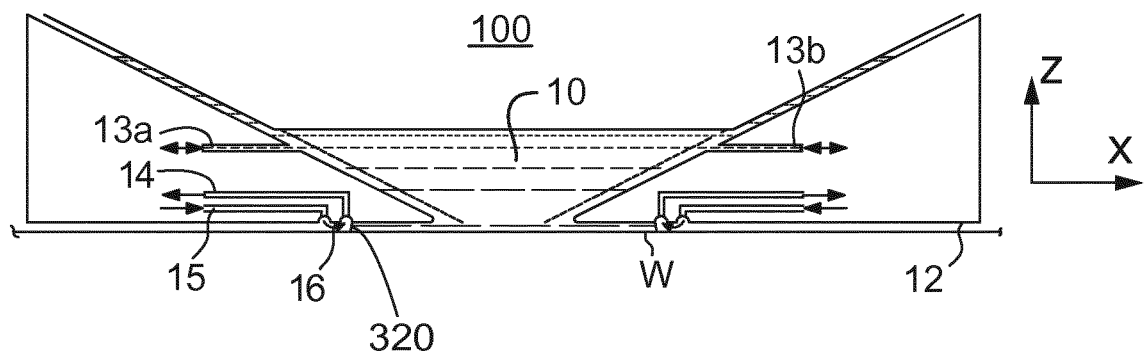
FIG. 2 schematically depicts a liquid confinement structure for use in the lithographic apparatus.

In an arrangement which been proposed for a localized immersion system a liquid confinement structure 12 extends along at least a part of a boundary of an immersion space 10 between the final optical element 100 of the projection system PS and the facing surface of the stage or table facing the projection system PS. The facing surface of the table is referred to as such because the table is moved during use and is rarely stationary. Generally, the facing surface of the table is a surface of a substrate W, support table WT, e.g. the substrate table which surrounds the substrate W or both. Such an arrangement is illustrated in FIG. 2. The arrangement illustrated in FIG. 2 and described below may be applied to the lithography apparatus described above and illustrated in FIG. 1.

FIG. 2 schematically depicts the liquid confinement structure 12. The liquid confinement structure 12 extends along at least a part of a boundary of the immersion space 10 between the final optical element 100 of the projection system PS and the support table WT or substrate W. In an embodiment, a seal is formed between the liquid confinement structure 12 and the surface of the substrate W/support table WT. The seal may be a contactless seal such as a gas seal 16 (such a system with a gas seal is disclosed in European patent application publication no. EP-A-1,420,298) or a liquid seal.

The liquid confinement structure 12 is configured to supply and confine immersion fluid, e.g., liquid, to the immersion space 10. Immersion fluid is brought into the immersion space 10 through one of liquid openings, e.g., opening 13a. The immersion fluid may be removed through one of liquid openings, e.g., opening 13b. The immersion fluid may be brought into the immersion space 10 through at least two liquid openings, e.g., opening 13a and opening 13b. Which of liquid openings is used to supply immersion fluid and optionally which is used to remove immersion liquid may depend on the direction of motion of the support table WT.

Immersion fluid may be contained in the immersion space 10 by the gas seal 16 which, during use, is formed between the bottom of the liquid confinement structure 12 and the facing surface of the table (i.e. the surface of the substrate W and/or the surface of the support table WT). The gas in the gas seal 16 is provided underpressure via gas inlet 15 to a gap between the liquid confinement structure 12 and substrate W and/or support table WT. The gas is extracted via a channel associated with gas outlet 14. The overpressure on the gas inlet 15, vacuum level on the gas outlet 14 and geometry of the gap are arranged so that there is a high-velocity gas flow inwardly that confines the immersion fluid. The force of the gas on the immersion fluid between the liquid confinement structure 12 and the substrate W and/or support table WT contains the immersion fluid in the immersion space 10. A meniscus 320 forms at a boundary of the immersion fluid. Such a system is disclosed in U.S. patent application publication no. US 2004-0207824. Other liquid confinement structures 12 can be used with embodiments of the present invention.

Figure 3:
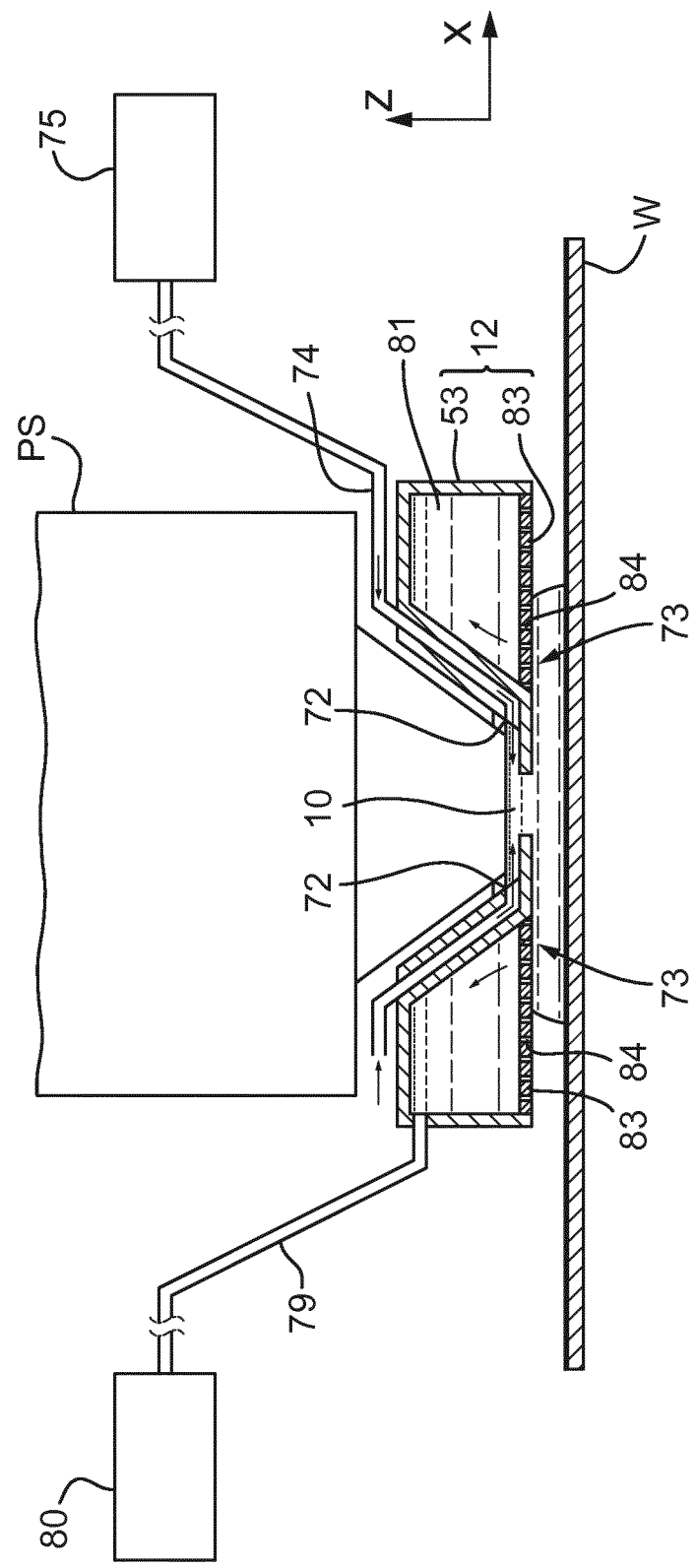
FIG. 3 is a side cross sectional view that schematically depicts a further liquid supply system according to an embodiment.

FIG. 3 is a side cross sectional view that depicts a further liquid supply system or fluid handling system according to an embodiment. The arrangement illustrated in FIG. 3 and described below may be applied to the lithographic apparatus described above and illustrated in FIG. 1. The liquid supply system is provided with a liquid confinement structure 12, which extends along at least a part of a boundary of the immersion space 10 between the final optical element of the projection system PS and the support table WT or substrate W. (Reference in the following text to surface of the substrate W also refers in addition or in the alternative to a surface of the support table WT, unless expressly stated otherwise.)

The liquid confinement structure 12 at least partly contains immersion fluid in the immersion space 10 between the final optical element of the projection system PS and the substrate W and/or support table WT. The immersion space 10 is at least partly formed by the liquid confinement structure 12 positioned below and surrounding the final optical element of the projection system PS. In an embodiment, the liquid confinement structure 12 comprises a main body member 53 and a porous member 83. The porous member 83 is plate shaped and has a plurality of holes 84 (i.e., openings or pores). In an embodiment, the porous member 83 is a mesh plate wherein numerous small holes 84 are formed in a mesh. Such a system is disclosed in United States patent application publication no. US 2010/0045949 A1.

The main body member 53 comprises one or more supply ports 72, which are capable of supplying the immersion fluid to the immersion space 10, and a recovery port 73, which is capable of recovering the immersion fluid from the immersion space 10. The one or more supply ports 72 are connected to a liquid supply apparatus 75 via a passageway 74. The liquid supply apparatus 75 is capable of supplying the immersion fluid to the one or more supply ports 72. The immersion fluid that is fed from the liquid supply apparatus 75 is supplied to the one or more supply ports 72 through the corresponding passageway 74. The one or more supply ports 72 are disposed in the vicinity of the optical path at a respective prescribed position of the main body member 53 that faces the optical path. The recovery port 73 is capable of recovering the immersion fluid from the immersion space 10. The recovery port 73 is connected to a liquid recovery apparatus 80 via a passageway 79. The liquid recovery apparatus 80 comprises a vacuum system and is capable of recovering the immersion fluid by sucking it via the recovery port 73. The liquid recovery apparatus 80 recovers the immersion fluid recovered via the recovery port 73 through the passageway 79. The porous member 83 is disposed in the recovery port 73.

In an embodiment, to form the immersion space 10 with the immersion fluid between the projection system PS and the liquid confinement structure 12 on one side and the substrate W on the other side, immersion fluid is supplied from the one or more supply ports 72 to the immersion space 10 and the pressure in a recovery chamber 81 in the liquid confinement structure 12 is adjusted to a negative pressure so as to recover the immersion fluid via the holes 84 (i.e., the recovery port 73) of the porous member 83. Performing the liquid supply operation using the one or more supply ports 72 and the liquid recovery operation using the porous member 83 forms the immersion space 10 between the projection system PS and the liquid confinement structure 12 and the substrate W.

Figure 4:
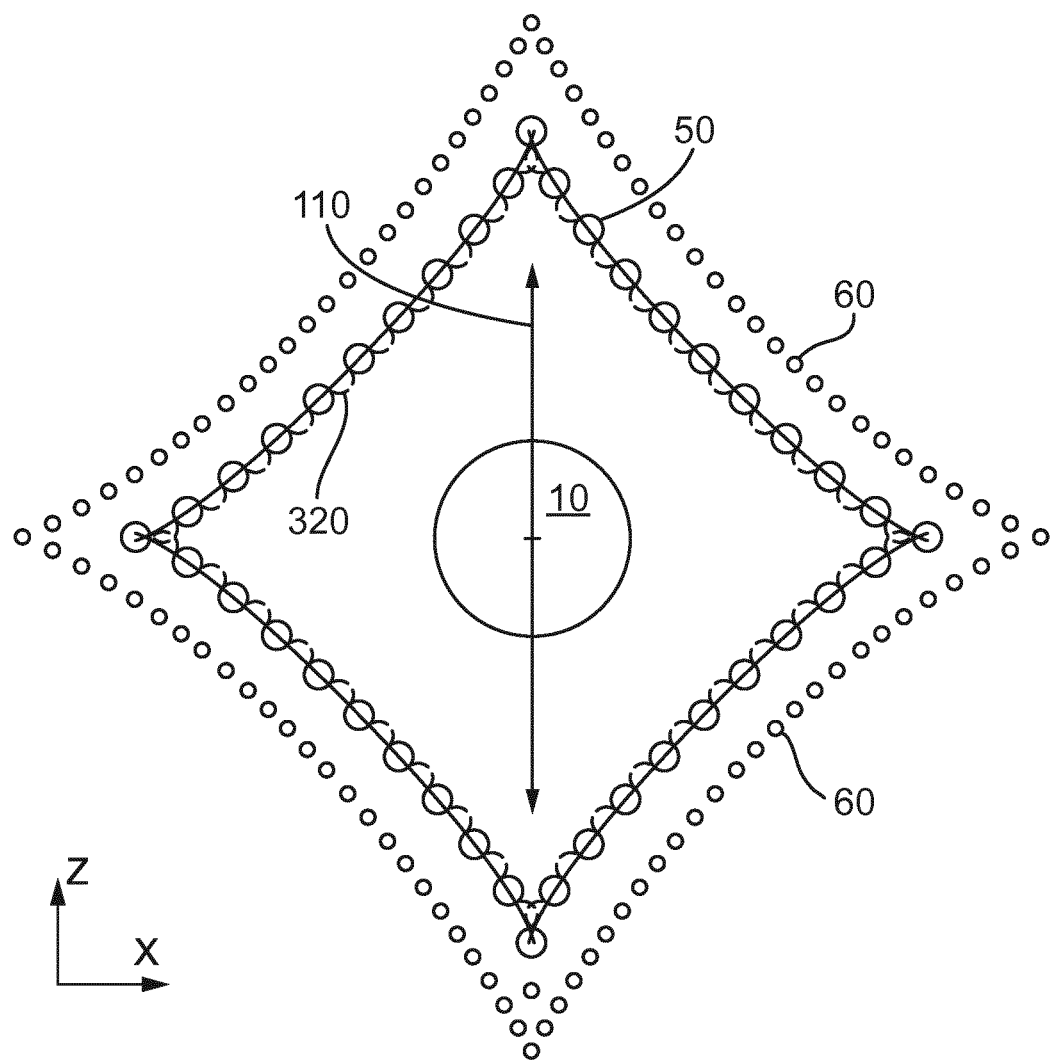
FIG. 4 schematically depicts a bottom surface of another further liquid confinement structure, in plan.
Figure 5:
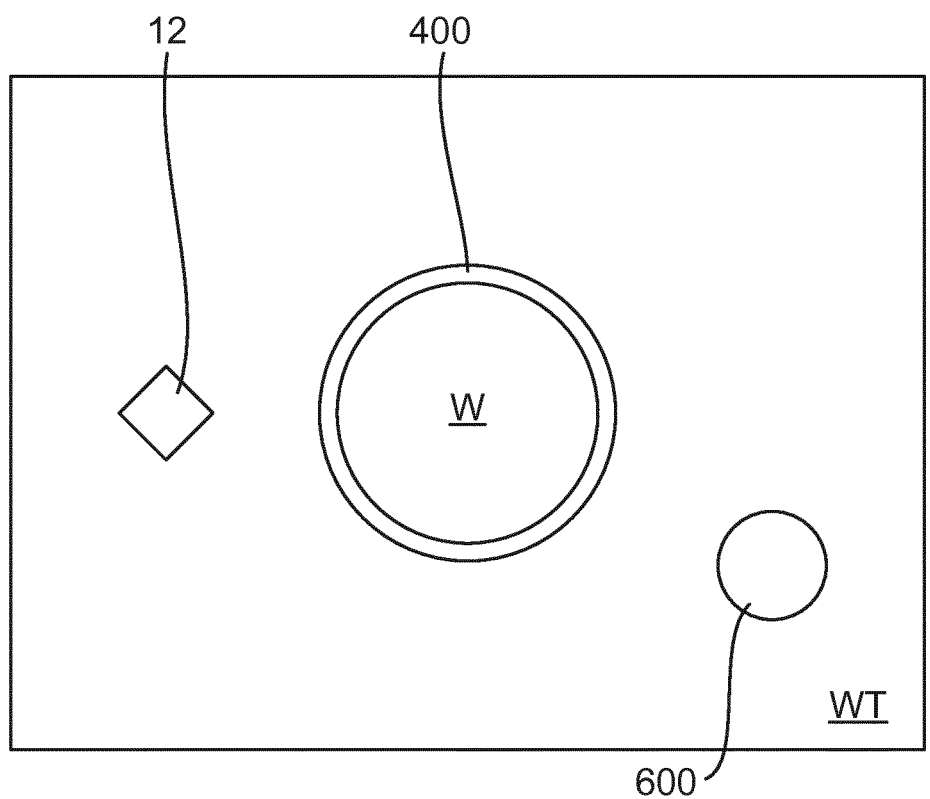
FIG. 5 schematically depicts, in plan, a top surface of a substrate table and a footprint of a liquid confinement structure.

FIG. 4 illustrates schematically and in plan meniscus controlling features of an immersion system including a liquid confinement structure 12 which may have outlets using the gas drag principle and to which an embodiment of the present invention may relate. The features of a meniscus controlling feature are illustrated which may, for example, replace the meniscus controlling features depicted by the gas seal 16, provided by the inlet 15 and the outlet 14 in FIG. 2. The meniscus controlling feature of FIG. 4 is a form of extractor, for example a dual phase extractor. The meniscus controlling feature comprises a series of openings formed in the liquid confinement structure 12, e.g. a plurality of discrete openings 50. Each opening 50 is illustrated as being circular, though this is not necessarily the case. Indeed, the shape is not essential and one or more of the openings 50 may be one or more selected from: circular, elliptical, rectilinear (e.g. square, or rectangular), triangular, etc., and one or more openings may be elongate.

There may be no meniscus controlling features radially inwardly of the openings 50. The meniscus 320 is pinned between the openings 50 with drag forces induced by gas flow into the openings 50. A gas drag velocity of greater than about 15 m/s, desirably about 20 m/s is sufficient. The amount of evaporation of immersion fluid from the substrate W may be reduced, thereby reducing both splashing of immersion fluid as well as thermal expansion/contraction effects.

Various geometries of the bottom of the fluid handling structure are possible. For example, any of the structures disclosed in U.S. patent application publication no. US 2004-0207824 or U.S. patent application publication no. US 2010-0313974 could be used in an embodiment of the present invention. An embodiment of the invention may be applied to a liquid confinement structure 12 which has any shape in plan, or has a component such as the outlets are arranged in any shape. Such a shape in a non-limiting list may include an ellipse such as a circle, a rectilinear shape such as a rectangle, e.g. a square, or a parallelogram such as a rhombus or a cornered shape with more than four corners such as a four or more pointed star, for example, as depicted in FIG. 4. The meniscus 320 of the immersion space 10 has the cornered shape. The cornered shape may be, for example, generally diamond-shaped with rounded corners. The sides may be slightly concave. The corners point in the scan (Y) and non-scan (X) directions so that the principal axes of the cornered shape are substantially orthogonal and respectively substantially parallel to the scan and non-scan directions. The major movements of the support table WT are in the scan and non-scan directions. The wet area corresponding to the interface between the immersion space 10 and the facing surface is sometimes referred to as a 'footprint'. In an embodiment as described, the liquid confinement structure 12 in operation has a footprint having a cornered shape. In another embodiment, the footprint has no corners and it may be substantially elliptical or circular, for example, but the footprint can be any shape.

Known lithographic apparatus may comprise a liquid confinement structure 12 comprising a gas knife. The gas knife can be used to help confine immersion fluid to the immersion space 10. Therefore, the gas knife can be useful in preventing immersion fluid from escaping from the immersion space 10, which could later lead to defects. Providing a strong gas knife is useful in preventing film pulling (where the liquid has a force applied to it due to passing over a sharp edge (e.g. the edge of the substrate) or a different pinning feature such as a hydrophilic surface) because a strong gas knife will reduce or prevent the amount of immersion fluid which is dragged behind the liquid confinement structure 12, and may break up the film faster to reduce the amount of immersion fluid left behind the liquid confinement structure 12. However, when the gas knife is strong, this may make defects on the advancing side of the gas knife worse, because as the gas knife collides with droplets of immersion fluid on the surface of the substrate W, a strong gas knife will not allow immersion fluid droplets to pass inwards of the gas knife. This means that the droplets of immersion fluid will be pushed forwards by the advancing side of the liquid confinement structure 12 which can lead to bulldozing. As film pulling and bulldozing can both cause defects which increase errors and possibly reduce yield, it is beneficial to address both of these issues simultaneously.

In the present invention an immersion lithographic apparatus is provided which comprises a liquid confinement structure 12. The liquid confinement structure 12 may be as described above, for example in relation to FIG. 4. The liquid confinement structure 12 is configured to confine immersion fluid to a region and comprises a gas knife system. The gas knife system may be configured to generate a gas knife in use. The gas knife may be radially outward of the space 10 (otherwise referred to as the region) and may contribute to confining the immersion fluid. The gas knife system comprises a series of openings formed in the liquid confinement structure 12 e.g. the gas knife system comprises passages each having an exit 60. The gas knife may be formed by gas exiting the exits 60 in use. The exits 60 form at least one side of a shape in plan view. The exits 60 may form at least one, multiple or all the sides of the shape in plan view. For example, the exits 60 may form the sides of a four pointed star as shown in FIG. 4. The shape may have a plurality of sides, for example any appropriate number of sides may be provided, e.g. 3, 4, 5, 6, 7, 8, 9, 10 or more. As described above, the exits 60 may form the sides of any shape and this is not particularly limiting. FIG. 4 depicts the scanning direction 110 as in-line with two of the points of the four point star but this may not be the case. The shape formed by the gas knife may be aligned with the scanning direction 110 in any selected orientation.

It should be noted that in a lithography apparatus it is normally the support table WT that moves while the projection system PS and liquid confinement structure 12 are stationary. However it is often convenient to describe motions of the support table WT as if the support table WT is stationary and the projection system PS and liquid confinement structure 12 move. An embodiment of the invention applies whether the support table WT and/or the projection system PS/liquid confinement structure 12 move.

To expose a series of target portions, a route comprised of a series of motions is typically calculated in advance. The route may be based on a meandering motion over the surface of the support table WT along successive fields in sequential rows across the substrate W surface. It includes scanning motions of the support table WT for each target portion to be exposed and transfer motions between scanning motions to line up the support table WT for the next scanning motion. During the exposure, the support table WT moves in a scan direction, e.g. the +Y direction, which is substantially perpendicular to the non-scan direction, or a reverse scan direction, e.g. the −Y direction. Exposures in a sequence alternate between the scan direction and the reverse scan direction. The exposure motions and the transfer motions therefore together form the route. The route may also include motions to perform measurements before, during, or after a sequence of exposures and motions for support table WT swap. During a route, the substrate W may move partly or completely out from underneath the liquid confinement structure 12. This occurs in particular when exposing an edge target portion, i.e. of a field which is adjacent to or overlaps the edge of the substrate W.

The below description will be given with reference to the immersion space 10 moving over the edge of a substrate W. However, the present invention is equally applicable to cases where the immersion space 10 passes over other objects on the support table WT, for example over a sensor, such as a sensor edge.

The present invention will be described with reference to the liquid confinement structure 12 of FIG. 4. However it will be appreciated that other liquid confinement structures 12 including those of FIGS. 2 and 3 could benefit from the present invention. The invention is applicable to any type of liquid confinement structure 12 irrespective of how the immersion fluid is confined to the footprint. For example the invention is applicable to a liquid confinement structure 12 without a flow of gas out of the liquid confinement structure 12 to help confine immersion fluid and also to a liquid confinement structure 12 with a two dimensional array of openings for the extraction of liquid and/or gas (e.g. extraction through a porous member).

In order to reduce or minimize the cost of ownership of a lithography apparatus, it is desirable to maximize throughput and yield. Throughput is the rate at which substrates are exposed. Yield is the proportion of devices formed on substrates by exposure in an immersion lithographic tool that function correctly. Because many exposure steps may be required to create a device, even a low rate of defects per exposure may result in a significant reduction of yield.

One source of exposure defects is deviations in temperature of the substrate W from a desired set-point temperature. The deviations in temperature may be in the form of a temperature gradient in the substrate W or in the form of an overall deviation from the desired set-point temperature.

Deviations in temperature of the substrate W can be incurred due to the presence of a thermal load at an edge of the substrate W. One source of a thermal load at the edge of a substrate W is the presence of immersion liquid at the edge of the substrate W. The thermal load is different depending upon whether there is a flow of gas past the edge of the substrate W through a gap 400 between the edge of the substrate W and the edge of a recess in the top surface of the support table WT in which the substrate W is positioned. The flow of gas in the gap 400 is due to the presence of an underpressure in the gap 400 applied by an extraction system which is designed to remove immersion liquid which finds its way into the gap 400 as a result of the liquid confinement structure 12 passing over the gap 400. The thermal load is a cooling thermal load, for example due to evaporation of liquid in the gap 400. The cooling thermal load when there is a gas flow in the gap is larger than that experienced if the liquid is left in the gap. However, leaving liquid in the gap is undesirable for other reasons (e.g. getting parts of the apparatus wet).

Attempts have been made to reduce the cooling thermal load at the edge of the substrate W due to the extraction of immersion liquid from the gap 400 (see for example U.S. patent application publication no. 2008-0304025 or U.S. patent application publication no. US 2013-0045447 in which the extraction process is performed for as short a time as possible by switching off the underpressure as soon as possible). JP 2011-222652 discloses a similar idea and splits the gap 400 surrounding the substrate W into discrete portions and only activates extraction from a discrete portion when liquid is present in that portion. However, the present inventors have found that such techniques can be improved. In particular the prior art techniques have been found to suffer from the fact that the thermal load induced around the edge of the substrate W using such methods is unpredictable. The thermal load has been found to vary from substrate to substrate, particularly at the start of imaging a lot of substrates.

The present inventors have devised a method of switching off (and on) the underpressure applied to the gap 400 by the extraction system. Unlike the prior art described above the invention does not aim at minimising the thermal impact of the extraction of immersion liquid from the gap 400. Instead the process is changed to make the contributions of the thermal load on the substrate W from periods when there is no gas flow and periods when there is gas flow more predictable (e.g. consistent between substrates). As a result any deviation from the desired set-point temperature of the substrate W can be predicted. If the deviation from the desired set-point temperature is known, any imaging errors induced by the temperature deviation can be predicted. Based on this prediction, it is possible to change the parameters used during projecting the patterned beam into the substrate W (i.e. during imaging) to compensate for the temperature deviation from the desired set point temperature. That is, in an embodiment, the invention is to make the combination of both contributors to the thermal fingerprint (evaporation with flow on and with flow off) better predictable, to enable compensation measures that can be applied across all substrates W of a lot.

Thus in the present invention a certain predetermined thermal profile is deliberately induced in the substrate W by the timing of switching off (and/or on) of the underpressure applied to the gap 400 by the extraction system. This is achieved by stopping application of the underpressure at a pre-determined time after the immersion space 10 moves off the substrate W for the last time during the series of motions and/or starting application of the underpressure to the extraction unit to remove fluid from a position proximate the edge of the substrate W a further pre-determined time before the immersion space 10 moves onto the substrate W.

Therefore rather than stopping application of the underpressure as soon as possible after the immersion space 10 moves off the substrate W for the last time during the series of motions like in the prior art, the underpressure is maintained on for a pre-determined time. The thermal loads on each substrate W are thereby more uniform because the thermal load applied to the substrate W when the underpressure is off and the thermal load applied to the substrate W when the underpressure is on is more similar from one substrate W to the next. Thus between loading, imaging and unloading of each substrate W, the thermal profile of each substrate W of a lot of substrates W is more uniform. As a result the imaging of each substrate W of a lot can be such as take into account the thermal profile of every substrate W. The prior art system of stopping extraction as soon as possible does not induce a predictable or consistent thermal profile into the substrate W. This is thought at least partially to be due to variations between the routes taken by the support table WT under the projection system PS from substrate W to substrate W. In the prior art, due to the variation in the timing of the activation of the extraction unit underpressure the thermal load at an edge of a substrate W differs from substrate W to substrate W in a lot of substrates W. The variation in thermal load has an effect on the temperature profile of a following substrate W. The inventors have determined that it is advantageous to have a consistent (though greater) thermal profile in all substrates and projecting the patterned beam to account for the certain pre-determined thermal profile expected to be in the substrate W. This contrasts to aiming for a minimum thermal deviation from a desired set-point temperature of the substrate W but in which the thermal profile from substrate to substrate varies. A higher overall yield is achievable with the present invention as compared to the prior art as a result.

The above description explains the invention with reference to a substrate W on a support table WT. However, the same principles can be applied to any object on a support table WT in which an extraction unit is present to remove fluid from a position proximate an edge of the object using an underpressure. The gap 400 may be treated as a single continuous gap around the whole object or it may be discretised into several gaps the underpressure of which is individually controllable.

An implementation of the present invention will now be described in detail. In an embodiment the control unit 120 controls the positioner 130 of the of the support table WT thereby to move the support table WT under the projection system PS along the route comprising the series of motions. The control unit 120 also controls an extraction unit controller 140.

Details of the desired route are sent to the control unit 120. The details of the desired route include information regarding the location of the immersion space 10 relative to the substrate W at the start of a motion, the location of the immersion space 10 relative to the substrate W at the end of a motion and the speed of movement and direction between the location at the start of the motion and a location at the end of the motion.

In an embodiment these details are available to the control unit 120 before the immersion space 10 has moved over the substrate W. Therefore it is possible for the control unit 120, prior to the immersion space 10 moving off the substrate W for the last time during the series of motions, to predict from the route a predicted finish time at which the immersion space 10 moves off the substrate W for the last time during the series of motions. By adding the pre-determined time after which the underpressure is no longer applied by the extraction system to the predicted finish time, a stop time for stopping application of the underpressure can be calculated. A command to stop application of the underpressure at the stop time can be generated and sent to the extraction unit controller 140.

By calculating the stop time in advance of the immersion space 10 moving off the substrate W, it is possible to ensure that the application of the underpressure will be stopped at the pre-determined time and there will be no risk of the pre-determined time passing before the relevant calculations are made by the control unit 120 to stop the application of the underpressure.

It is possible that immersion liquid is left in the gap 400 after the underpressure is no longer applied by the extraction unit Immersion liquid left standing in the gap 400 is thermally conditioned by the support table WT and the gap 400 is in any case relatively narrow so that less evaporation of the immersion liquid (and thereby generation of a cooling load) occurs compared to when a gas flow is present. However, any resulting thermal load may not be negligible.

The pre-determined time may be any length of time so long as it is consistent between the substrates W. On the basis of the pre-determined time the thermal pattern in the substrates W can be measured experimentally and/or predicted and the projecting of a patterned beam onto target portions of the substrate W can be performed to take account of the pre-determined thermal profile in the substrate W.

In an embodiment application of the underpressure is started a further pre-determined time before the immersion space 10 moves onto the substrate W for the first time during the series of motions. The further pre-determined time is a length of time which is greater than or equal to a time taken for the underpressure applied by the extraction unit to reach a pre-determined magnitude (for example the normal operational underpressure level or magnitude). That is, the extraction unit may take a certain amount of time to generate a stable desired level of underpressure in the gap 400 and the further pre-determined time is preferably greater than the minimum time to achieve that stable magnitude.

The time at which the underpressure is started is deemed as the start time and this can be calculated by the control unit 120 on the basis of a predicted start time at which the immersion space 10 moves onto the object for the first time during the series of motions. This information is available from or can be calculated from the details of the route. By subtracting the further pre-determined time from the predicted start time, the start time can be generated and sent to the extraction unit controller 140.

In an embodiment the length of the pre-determined time is greater than the length of the further pre-determined time. This has been found to result in the lowest difference in thermal profile between substrates.

In an embodiment the controller 120 is aware of the extraction unit dimensions and the liquid confinement structure 12 dimensions (and so the immersion space 10 dimensions) and uses this in the calculation of the stop time and/or start time. This improves accuracy of the calculations of exactly when an edge of the immersion space 10 moves onto/off the substrate W.

The controller 120 can also be used to avoid damage to the substrate W and/or resist on the substrate W and deleterious thermal effects which can result in overlay problems as a result of the immersion space 10 remaining in one position on the substrate W and/or support table WT for an extended period of time. This is achieved by moving the support table WT such that the liquid confinement structure 12 hovers above a park position 600. The park position 600 may, for example, be above a sensor. In an embodiment the controller 120 controls the stage positioner 130 to move the support table WT to the park position 600 based upon information from the route, independent of other considerations such as stage of processes within the apparatus and/or current use of the apparatus. This can be seen as an autonomous process. The autonomous process performs the park move when either there is a large enough period of time during which the support table WT is standing still (for example waiting for a different object table to finish measurements at a measurement position), or when the liquid confinement structure 12 is hovering above the substrate W or the gap 400 and the support table WT is not moving.

The invention has been described above in relation to a method of starting and stopping application of an underpressure to the extraction unit before and after moving the support table along a route comprising a series of motions wherein the motions are motions during exposing the substrate. However the invention is equally applicable to starting and stopping the application of an underpressure to the extraction unit before and after moving the object under the projection system for any other reason. Such movement may or may not be along a route such that a plurality of target portions on the object pass under the projection system. For example, the overall movement of the support table could be from one location where the immersion space is over a sensor, and the support table is then moved such that the immersion space is over a different location, for example during swapping of one support table for another under the projection system. During such motion the immersion space may pass over the object (and so over gap 400). In that case the same method as described above can be used, namely starting application of an underpressure to the extraction unit to remove fluid from a position proximate an edge of the object before the immersion space moves onto the object and stopping application of the underpressure at a predetermined time after the immersion space moves off the object for the last time during the movement. The predetermined time may be different for different types of motion, or may be the same. The further predetermined time before the immersion space moves onto the object may also be different than for the embodiment where the substrate is being exposed, or may be the same.

All of the above mentioned defectivity sources are difficult to diagnose without knowing exactly the status of the gas flow and presence or otherwise of liquid in the gap 400. For example, there may be three extraction points distributed around the entire circumference of the gap 400. It is possible to measure the pressure and flow rate of fluid through each of those extraction points. However this does not give accurate information as to the presence or otherwise of liquid in the gap or of fluid flow around the entire circumference of the gap 400.

The present inventors have invented a way of using exactly the effect which the above described method of stopping the application of the underpressure to the gap 400 at a predetermined time after the immersion space moves off the object for the last time is intended to avoid in order to get a better idea of what is happening in the gap 400. The method is advantageous because it can be performed in-line without opening up the lithographic apparatus which means the method is fast, low cost and free of the risk of introducing additional contamination into the system.

In the method, a first layer on a substrate is exposed in the lithographic apparatus during which extraction from the gap 400 is switched off. Additionally no heating of the support table WT takes place. The first layer is then developed. A second layer on the same substrate is then exposed in the lithographic apparatus. When the second layer is exposed in the lithographic apparatus, extraction from the gap 400 is turned on. During exposure of the second layer the heating of the support table WT is also turned off.

Any difference in cooling load during exposing of the first layer compared to the second layer will manifest itself as an overlay error between the first and second layer. Therefore after developing the second layer, a measurement of the overlay error between the first layer and the second layer provides information regarding the effect of switching on the extraction from the gap 400. In this way, by determining the overlay error, particularly around the edge of the substrate W, a picture can be built up of the flow or the variation in flow of gas around the circumference of the gap 400. The substrate support WT heaters are turned off as they would otherwise partly compensate for the effect of turning on the flow of gas through the gap 400. Therefore the overlay error is maximised, meaning that the sensitivity of the measurement is increased.

This method can be used to determine characteristic thermal profiles induced by use of a particular gas flow through the gap 400 and thereby establish a model of the actual gas flow through the gap 400. On the basis of this, an acceptable range of parameters for operation of the extraction unit connected to the gap 400 can be determined. That is, a lower limit of gas flow for acceptable defectively (bubbles and splashing) can be determined and an upper limit for acceptable overlay error (due to induced thermal profiles) can be determined.

In an embodiment, instructions to calculate or perform the route may take the form of a computer program containing one or more sequences of machine-readable instructions describing a method as disclosed above, or a data storage medium (e.g. semiconductor memory, magnetic or optical disk) having such a computer program stored therein. The computer program can be applied as an upgrade to an existing lithography apparatus.

In an embodiment, there is provided a device manufacturing method comprising: confining a liquid to an immersion space between a projection system and a facing surface of an object on a support table and/or the support table using a liquid confinement structure; starting application of an underpressure to an extraction unit to remove fluid from a position proximate an edge of the object before the immersion space moves onto the object; moving the support table along a route comprising a series of motions such that a plurality of target positions on the object pass under the projection system; projecting through the immersion space a patterned beam onto the target portions of the object as the target portions pass under the projection system, wherein the projecting is performed to account for a certain predetermined thermal profile in the object; and stopping application of the underpressure at a predetermined time after the immersion space moves off the object for the last time during the series of motions, thereby at least partly to induce the certain predetermined thermal profile in the object.

In an embodiment, the method further comprises: prior to the immersion space moving off the object for the last time during the series of motions, predicting from the route a predicted finish time at which the immersion space moves off the object for the last time during the series of motions, adding the predetermined time to the predicted finish time thereby to calculate a stop time and generating a command to stop application of the underpressure at the stop time. In an embodiment, the method further comprises starting application of the underpressure a further predetermined time before the immersion space moves onto the object for the first time during the series of motions, thereby at least partly to induce the certain predetermined thermal profile in the object. In an embodiment, the method further comprises: prior to the immersion space moving onto the object for the first time during the series of motions, predicting from the route a predicted start time at which the immersion space moves onto the object for the first time during the series of motions, subtracting the further predetermined time from the predicted start time thereby to calculate a start time and generating a command to start application of the underpressure at the start time. In an embodiment, the predicting is at least partly based on data relating to the extraction unit dimensions and liquid confinement structure dimensions. In an embodiment, the length of the predetermined time is greater than the length of the further predetermined time. In an embodiment, the further predetermined time is greater than or equal to a start-up time taken for the underpressure applied to the extraction unit to reach a predetermined magnitude. In an embodiment, liquid remains in the extraction unit after the predetermined time.

In an embodiment, there is provided an immersion lithography apparatus comprising: a support table configured to support an object having at least one target portion; an extraction unit for removing fluid from a position proximate an edge of the object; a projection system configured to project a patterned beam onto the object; a positioner configured to move the support table relative to the projection system; a liquid confinement structure configured to confine a liquid to an immersion space between the projection system and a surface of the object and/or the support table; and a controller configured to control the positioner to move the support table to follow a route comprised of a series of motions such that a plurality of target positions on the object pass under the projection system, the controller adapted to: start application of an underpressure to the extraction unit to remove fluid from a position proximate an edge of the object before the immersion space moves onto the object; control the projection system to project through the immersion space a patterned beam onto the target portions of the object as the target portions pass under the projection system, in which the projecting is performed to account for a certain predetermined thermal profile in the object; and stop application of the underpressure a predetermined time after the immersion space moves off the object for the last time during the series of motions, thereby at least partly to induce the certain predetermined thermal profile in the object.

In an embodiment, the controller is further adapted to: prior to the immersion space moving off the object for the last time during the series of motions, predict from the route a predicted finish time at which the immersion space moves off the object for the last time during the series of motions, add the predetermined time to the predicted finish time thereby to calculate a stop time and generate a command to stop application of the underpressure at the stop time. In an embodiment, the controller is further adapted to start application of the underpressure a further predetermined time before the immersion space moves onto the object for the first time during the series of motions, thereby at least partly to induce the certain predetermined thermal profile in the object. In an embodiment, the controller is further adapted to: prior to the immersion space moving onto the object for the first time during the series of motions, predict from the route a predicted start time at which the immersion space moves onto the object for the first time during the series of motions, subtract the further predetermined time from the predicted start time thereby to calculate a start time and generate a command to start application of the underpressure at the start time. In an embodiment, the predicting is at least partly based on data relating to the extraction unit dimensions and liquid confinement structure dimensions. In an embodiment, the length of the predetermined time is greater than the length of the further predetermined time. In an embodiment, the further predetermined time is greater than or equal to a time taken for the underpressure applied to the extraction unit to reach a predetermined magnitude.

Although specific reference may be made in this text to the use of lithography apparatus in the manufacture of ICs, it should be understood that the lithography apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive, reflective, magnetic, electromagnetic and electrostatic optical components.

While specific embodiments have been described above, it will be appreciated that embodiments of the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. A device manufacturing method comprising:
   confining a liquid to an immersion space between a projection system and a facing surface of an object on a support table and/or of the support table, using a liquid confinement structure;
   starting application of an underpressure to an extraction unit to remove fluid from a position proximate an edge of the object before the immersion space moves onto the object;
   moving the support table along a route comprising a series of motions such that a plurality of target positions on the object pass under the projection system;
   projecting through the immersion space a patterned beam onto individual ones of the target portions of the object as the target portions pass under the projection system, wherein the projecting is performed to account for a certain predetermined thermal profile in the object; and
   stopping application of the underpressure at a predetermined time after the immersion space moves off the object for the last time during the series of motions, to at least partly induce the certain predetermined thermal profile in the object.

2. The device manufacturing method of claim 1, further comprising:
   prior to the immersion space moving off the object for the last time during the series of motions, predicting from the route a predicted finish time at which the immersion space moves off the object for the last time during the series of motions,
   adding the predetermined time to the predicted finish time to calculate a stop time, and
   generating a command to stop application of the underpressure at the stop time.

3. The device manufacturing method of claim 2, wherein the predicting is at least partly based on data relating to the extraction unit dimensions and liquid confinement structure dimensions.

4. The device manufacturing method of claim 1, further comprising starting application of the underpressure a further predetermined time before the immersion space moves onto the object for the first time during the series of motions, to at least partly induce the certain predetermined thermal profile in the object.

5. The device manufacturing method of claim 4, further comprising:
   prior to the immersion space moving onto the object for the first time during the series of motions, predicting from the route a predicted start time at which the immersion space moves onto the object for the first time during the series of motions,
   subtracting the further predetermined time from the predicted start time to calculate a start time, and
   generating a command to start application of the underpressure at the start time.

6. The device manufacturing method of claim 4, wherein the length of the predetermined time is greater than the length of the further predetermined time.

7. The device manufacturing method of claim 4, wherein the further predetermined time is greater than or equal to a start-up time taken for the underpressure applied to the extraction unit to reach a predetermined magnitude.

8. The device manufacturing method of claim 1, wherein liquid remains in the extraction unit after the predetermined time.

9. An immersion lithography apparatus comprising:
   a support table configured to support an object having at least one target portion;
   an extraction unit for removing fluid from a position proximate an edge of the object;
   a projection system configured to project a patterned beam onto the object;
   a positioner configured to move the support table relative to the projection system;
   a liquid confinement structure configured to confine a liquid to an immersion space between the projection system and a surface of the object and/or the support table; and
   a controller configured to control the positioner to move the support table to follow a route comprised of a series of motions such that a plurality of target positions on the object pass under the projection system, the controller adapted to at least:
      start application of an underpressure to the extraction unit to remove fluid from a position proximate an edge of the object before the immersion space moves onto the object;
      control the projection system to project through the immersion space a patterned beam onto individual ones of the target portions of the object as the target portions pass under the projection system, in which the projecting is performed to account for a certain predetermined thermal profile in the object; and
      stop application of the underpressure a predetermined time after the immersion space moves off the object for the last time during the series of motions, to at least partly induce the certain predetermined thermal profile in the object.

10. The immersion lithographic apparatus of claim 9, wherein the controller is further adapted to:
    prior to the immersion space moving off the object for the last time during the series of motions, predict from the route a predicted finish time at which the immersion space moves off the object for the last time during the series of motions, add the predetermined time to the predicted finish time to calculate a stop time, and generate a command to stop application of the underpressure at the stop time.

11. The immersion lithographic apparatus of claim 10, wherein the prediction is at least partly based on data relating to the extraction unit dimensions and liquid confinement structure dimensions.

12. The immersion lithographic apparatus of claim 9, wherein the controller is further adapted to start application of the underpressure a further predetermined time before the immersion space moves onto the object for the first time during the series of motions, to at least partly induce the certain predetermined thermal profile in the object.

13. The immersion lithographic apparatus of claim 12, wherein the controller is further adapted to:

prior to the immersion space moving onto the object for the first time during the series of motions, predict from the route a predicted start time at which the immersion space moves onto the object for the first time during the series of motions, subtract the further predetermined time from the predicted start time thereby to calculate a start time, and generate a command to start application of the underpressure at the start time.

14. The immersion lithographic apparatus of claim 12, wherein the length of the predetermined time is greater than the length of the further predetermined time.

15. The immersion lithographic apparatus of claim 12, wherein the further predetermined time is greater than or equal to a time taken for the underpressure applied to the extraction unit to reach a predetermined magnitude.

16. A non-transitory computer-readable medium comprising instructions therein, the instructions, upon execution by a computer system, configured to cause the computer system to at least:

start application of an underpressure to an extraction unit to remove fluid from a position proximate an edge of an object before an immersion space moves onto the object, wherein the object is caused to follow a route comprised of a series of motions such that a plurality of target positions on the object pass under a projection system of a lithographic apparatus while liquid is confined to the immersion space between the projection system and a surface of the object and/or of a support table of the object;

control the projection system to project through the immersion space a patterned beam onto individual ones of the target portions of the object as the target portions pass under the projection system, in which the projection is performed to account for a certain predetermined thermal profile in the object; and stop application of the underpressure a predetermined time after the immersion space moves off the object for the last time during the series of motions, to at least partly induce the certain predetermined thermal profile in the object.

17. The computer-readable medium of claim 16, wherein the instructions are further configured to cause, upon execution by the computer system, the computer system to:

prior to the immersion space moving off the object for the last time during the series of motions, predict from the route a predicted finish time at which the immersion space moves off the object for the last time during the series of motions, add the predetermined time to the predicted finish time to calculate a stop time, and generate a command to stop application of the underpressure at the stop time.

18. The computer-readable medium of claim 16, wherein the instructions are further configured to cause, upon execution by the computer system, the computer system to start application of the underpressure a further predetermined time before the immersion space moves onto the object for the first time during the series of motions, to at least partly induce the certain predetermined thermal profile in the object.

19. The computer-readable medium of claim 18, wherein the instructions are further configured to cause, upon execution by the computer system, the computer system to:

prior to the immersion space moving onto the object for the first time during the series of motions, predict from the route a predicted start time at which the immersion space moves onto the object for the first time during the series of motions, subtract the further predetermined time from the predicted start time to calculate a start time, and generate a command to start application of the underpressure at the start time.

20. The computer-readable medium of claim 18, wherein the length of the predetermined time is greater than the length of the further predetermined time or wherein the further predetermined time is greater than or equal to a time taken for the underpressure applied to the extraction unit to reach a predetermined magnitude.

* * * * *